United States Patent [19]

Nicholas

[11] Patent Number: 5,132,821
[45] Date of Patent: Jul. 21, 1992

[54] COLOR LCD INCLUDING TRANSISTORS HAVING LAYER THICKNESSES SELECTED FOR SMALL PHOTOCURRENTS

[75] Inventor: Keith H. Nicholas, Reigate, England

[73] Assignee: U.S. Philips Corporation, New York, N.Y.

[21] Appl. No.: 558,725

[22] Filed: Jul. 26, 1990

[30] Foreign Application Priority Data

Aug. 16, 1989 [GB] United Kingdom ............... 8918678

[51] Int. Cl.$^5$ ................ G02F 1/1343; G02F 1/1335; G02B 1/10; G02B 5/28
[52] U.S. Cl. ..................................... 359/59; 357/23.7; 359/587; 359/590; 359/68
[58] Field of Search ........... 350/164, 333, 334, 339 R, 350/339 F; 357/23.7; 359/59 US, 62 US, 587, 590, 66 US, 68 US; 250/226

[56] References Cited

U.S. PATENT DOCUMENTS

| | | | |
|---|---|---|---|
| 4,556,599 | 12/1985 | Sato et al. | 350/164 X |
| 4,810,060 | 3/1989 | Ukai | 350/333 |
| 4,862,237 | 8/1989 | Morozumi | 357/30 |
| 4,865,405 | 9/1989 | Kageyama | 350/164 X |
| 4,888,632 | 12/1989 | Haller | 357/23.7 |
| 4,989,954 | 2/1991 | Yokoyama et al. | 350/337 |
| 4,997,241 | 3/1991 | Muratomi | 350/164 X |
| 5,046,825 | 9/1991 | Fertig | 359/87 |
| 5,058,997 | 10/1991 | Dickerson et al. | 359/59 |

FOREIGN PATENT DOCUMENTS 54-143246 11/1979 Japan.
60-120322 6/1985 Japan.
61-156106 7/1986 Japan.

Primary Examiner—Stanley D. Miller
Assistant Examiner—Ron Trice
Attorney, Agent, or Firm—John C. Fox

[57] ABSTRACT

A color display device has groups of liquid crystal display elements controlled by respective TFTs, the groups providing respective different color outputs, e.g. red, green and blue, and being either interspersed in a single panel with individual elements associated with color filter elements or in respective separate panels illuminated by differently colored light. The TFTs are of multilayer structure having semiconductor, gate insulator and gate layers. At least one layer thickness of the TFTs is different from group to group and is selected in accordance with the color light to which they are subjected so as to reduce absorption of that light, and consequently photo-induced currents in their semiconductor layers. Significantly reduced absorption is achievable by appropriate choice for example of semiconductor and insulator layer thicknesses based on optical interference considerations. The device can be used as a projection display device.

30 Claims, 4 Drawing Sheets

COLOR LCD INCLUDING TRANSISTORS HAVING LAYER THICKNESSES SELECTED FOR SMALL PHOTOCURRENTS

BACKGROUND OF THE INVENTION

This invention relates to an active matrix liquid crystal display device comprising a multiplicity of liquid crystal display elements, each of which is controlled by a thin film transistor having a gate layer, a semiconductor layer providing a channel region insulated from the gate layer by a gate insulation layer, and means for illuminating the display elements, the display elements comprising groups providing outputs in respective different colors.

Display devices of the above kind are well known. In a typical example the display device comprises a display panel having a pair of spaced, parallel, transparent substrates between which liquid crystal material is disposed. One substrate carries a row and column array of display element electrodes, sets of row and column address conductors and substantially identical thin film transistors, each of which is connected between a respective display element electrode and an associated pair of address conductors with its gate, source and drain terminals connected respectively to the row conductor, the column conductor, and the display element electrode. The other substrate carries a common electrode and a pattern of red, green and blue color filter elements in the form of a micro-filter array, the pattern being such that three adjacent display elements constitute a color triplet. The array thus consists of three interspersed groups of respectively colored (red, green and blue) display elements. The arrangement of the display elements within each triplet, and of the triplets with respect to their neighbours, can be varied. In operation, the array of display elements is illuminated with light and controlled via its TFT to modulate the light and provide a color output according to its filter elements.

Such a display device may be used as a projection display device in which intense white light is directed onto the substrate carrying the filter elements and is modulated appropriately by the individual display elements whose outputs are collectively projected onto a display screen by a projection lens.

In another known kind of liquid crystal color projection display device, the display elements are arranged as three separate groups, for example using three physically separate display panels, and each group is illuminated with light of a respective, different, primary color. The outputs of the individual display elements of each of the groups are combined and projected onto a display screen by a projection lens. In this case the display device can be regarded as comprising three monochromatic display panels providing a polychromatic display by combining their outputs. As such, individual color filter elements are not required.

Typically, the TFTs comprise amorphous silicon or polycrystalline silicon devices. These are fabricated on the one substrate by successive deposition and definition of thin film layers, for example comprising: a semiconductor layer of amorphous silicon or polycrystalline silicon, which provides a channel region; an insulative layer overlying the channel region and serving as a gate insulator, and a conductive layer overlying the channel region, and separated therefrom by the insulative layer, forming a gate. Source and drain contacts are provided at the ends of the channel region. An oxide or nitride passivation layer is normally used to cover this structure.

The semiconductor materials commonly used in TFTs, particularly amorphous silicon and polysilicon materials, have the undesirable property of being photoconductive. In an amorphous silicon TFT a metal gate can serve to reduce the amount of light reaching the semiconductor layer but not always adequately. In polysilicon TFTs, gates of doped polysilicon or silicide are often used which are not particularly effective in blocking light. Induced photocurrents caused by light reaching the channel region can influence significantly the off resistance of the TFT leading to a degradation in the performance of its associated display element. If large numbers of the TFTs are affected in this manner, then poor display quality results.

In order to alleviate this problem to some extent light shields have been incorporated in the device's structure to block light from the light source in the direction of TFTs. These light shields consist of regions of light absorbing material carried on the substrate facing the light source, between the filter elements if present, and overlying a respective TFT. In addition a metal pad may be provided on top of the TFT structure in cases where the channel region of the TFT is located closer to the liquid crystal than the gate.

Besides being inconvenient, the provision of light shields is not always an altogether effective solution.

OBJECTIVES AND SUMMARY OF THE INVENTION

It is an object of the present invention to provide an active matrix liquid crystal color display device in which the aforementioned undesirable effects of light on the TFTs are reduced.

To this end, a high degree of immunity from photo-induced currents in the TFT is provided by the structure of the TFTs themselves.

According to the present invention, an active matrix liquid crystal color display device of the kind described in the opening paragraph is characterised in that the thickness of at least one of said layers of the TFTs differ from one group to another and are selected in accordance with the color light with which each group operates so as to reduce absorption of said color light in the semiconductor layer.

The invention involves a recognition that the photosensitivity of the TFTs is wavelength dependent. Also, it has been determined that absorption of light in the semiconductor layer and the extent of such absorption is largely conditional on optical interference effects in their layers due to layer thickness typically employed. This is the case particularly in polycrystalline silicon TFTs which use gate materials exhibiting significant transparency but applies also to other TFTs such as amorphous silicon TFTs. All the layers of a TFT contribute to interference effects. It can be shown that photoconductivity in the semiconductor layer constituting the channel is, to a first approximation, proportional to absorption of light in this layer. Such absorption is dependent mainly on the thicknesses of the semiconductor and gate insulator layers. Varying the thickness of the gate insulator layer, for example, has the effect of correspondingly varying absorption of light of a given wavelength in the semiconductor layer. By appropriate selection for example of the thickness of the gate insulator layer and semiconductor layer, therefore, the amount of absorption in the semiconductor layer for a certain wavelength, or range of wavelengths, when the display device is illuminated by light directed from the side of the liquid crystal remote from the TFTs, can be brought towards a minimum.

Thus for a display device whose display elements operate with, for example, red, green and blue light, a layer thickness of the TFTs associated with the red operating display elements differs from that of the corresponding layer of the TFTs associated with green and blue operating display elements and likewise a layer thickness of the TFTs associated with blue operating display elements will be different to that of the TFTs associated with green operating display elements.

Preferably, the thicknesses of at least the semiconductor and gate insulation layers of the TFTs are selected according to the color of light concerned to minimise light absorption in the semiconductor layer through interference effects.

The semiconductor layer and gate insulation layer thickness are considered the more important in determining absorption characteristics in the semiconductor layer. By appropriate selection of the layer thickness, absorption in the semiconductor layer approaches a minimum. However, the gate insulation layer thickness is thought to have the greater influence, particularly in the case of a transparent gate material being used, and some beneficial results in reducing the amount of absorption in the semiconductor layer can be gained by tailoring the thickness of this layer alone.

The thickness of the gate layer can also play a part and by appropriate choice can further reduce absorption. The effect of this layer is dependent on the material used. In a polysilicon TFT, the gate material may typically be polysilicon (doped) or silicide, both of which are transparent to light in the kind of thicknesses commonly used, and therefore the gate contributes to interference effects. Consequently, the gate layer preferably also is of a thickness selected, in conjunction with gate insulation and semiconductor layers, to reduce still further light absorption in the semiconductor layer. In the case of the gate layer comprising a metal, as in many amorphous silicon TFTs, which could be expected to be opaque, it is considered that beneficial reduction in light absorption in the semiconductor layer may still be obtained by tailoring the thickness of the gate insulation or semiconductor layers in the aforementioned manner.

Each layer of the TFT's structure therefore can add to the effect and contributes to the reduction in absorption in the semiconductor layer.

If a passivation layer is provided overlying the gate as part of the TFT structure, then this layer too may be optimised in thickness for the purpose of minimising light absorption in the semiconductor layer in conjunction with pre-selected thickness of the other layers of the TFT as described.

In an embodiment which can be expected to exhibit particularly advantageous results, the optical thickness of the gate insulation and semiconductor layers of the TFTs are selected to be approximately an odd multiple of one quarter of the principal wavelength of the color light to which they are subjected in operation of the device. In other words, the layer thicknesses are approximately equal to $n\lambda/4$ where $\lambda$ is the principal wavelength and n is an odd number. The value of n, for example 3 or 5, may be selected having regard to the ease of fabrication and the function the layer has to fulfil in operation of the TFT. A further improvement may be obtained by selecting the optical thicknesses of the gate and passivation layers, assuming the gate material used is one which is transparent to some extent, to be respectively an odd multiple of one quarter wavelengths and an odd multiple of half wavelengths of the color light approximately.

The effect of these selected layer thicknesses is such that some of the light arriving at a TFT is reflected and/or absorbed by the layers and interfaces preceding the semiconductor layer and that light entering the semiconductor layer is largely transmitted therethrough rather than being absorbed.

The invention can be applied to a display device comprising a display panel having an array of display elements and an array of color filter elements, each of which is associated with a respective display element, with the filter elements of the array comprising two or more different color filter element sets, or to a display device of the kind comprising two or more display panels each having an array of display elements and illuminated with light of a respective and different color. In the former arrangement, the TFTs are formed as sets, the number of sets corresponding to the number of color filter sets. Thus, for a full color display device employing a matrix of red, green and blue filter elements three sets of TFTs are used, one layer thickness at least of each set being different to that of the other sets. In the latter arrangement, the TFTs of a panel are substantially identical so far as their layer thicknesses are concerned but the TFTs employed in any one panel differ from those employed in the other panels.

In an embodiment of the display device, means are provided for illuminating the display elements from the side of the liquid crystal material remote from the TFTs. In the aforementioned single panel form of the device using a filter element array, the illuminating means may comprise a white light source. The display device may be viewed directly. Alternatively the outputs of the individual display elements may be projected onto a screen, via a projection lens, where they combine to form a display picture. In a device comprising two or more panels a respectively colored light source may be used for each panel. Alternatively a common source of white light may be provided with the light being split into different color components, for example by means of a dichroic mirror arrangement. The outputs from the panels are combined and projected onto a display screen via a projection lens to produce a display picture.

BRIEF DESCRIPTION OF THE DRAWINGS

Active matrix liquid crystal color display devices in accordance with the present invention will now be described, by way of example, with reference to the accompanying drawings, in which.

DESCRIPTION OF THE PREFERRED EMBODIMENTS

Figure 1:
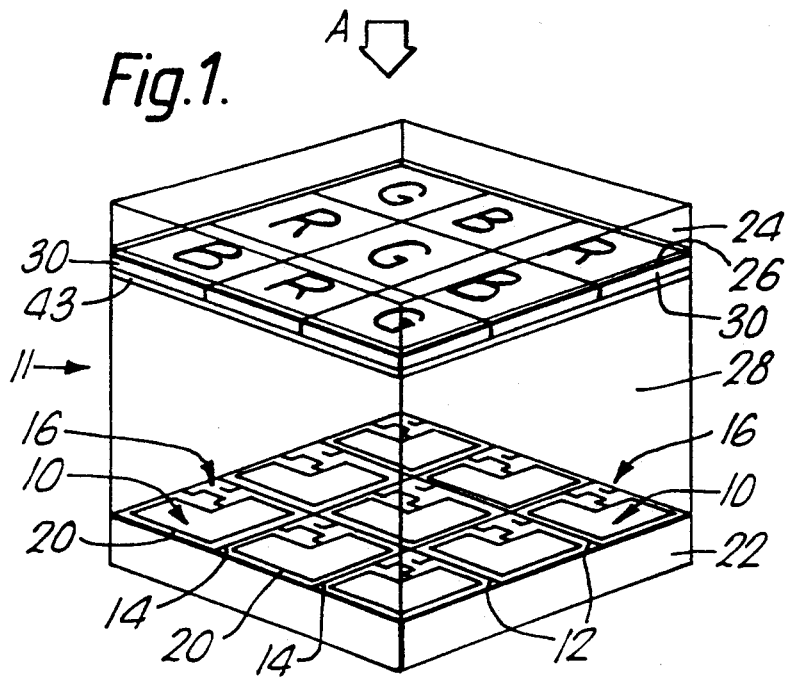
FIG. 1 is a schematic perspective view, not to scale, through a part of an embodiment of a liquid crystal display device according to the invention and showing particularly a few, typical, display elements and their associated control TFTs in a display panel of the device.

Referring to FIG. 1, the display device, which is suitable for full color displays such as color TV pictures, comprises a display panel 11 having a row and column array of individually-operable, generally rectangular, display elements 10, only nine of which are present in the part of the panel shown. In practice the total number of display elements in the panel may be 100,000 or more.

Each display element is associated with a respective thin film transistor, TFT, 16 and is located adjacent the intersection of sets of row and column address conductors 12 and 14 with the boundaries of the display elements being determined by the spacings between adjacent pairs of the row and column conductors. For the sake of simplicity, the conductors 12 and 14 and the TFTs 16 are represented in FIG. 1 by plain lines and symbols respectively.

The gate eletrodes of all TFTs associated with display elements in the same row are connected to a common row conductor 12 to which, in operation, switching (gating) signals are supplied. Likewise, the source electrodes associated with all display elements in the same column are connected to a common column conductor 14 to which data (video) signals are applied. The drain electrodes of the TFTs are connected to respective transparent display element electrodes 20 of ITO forming part of, and defining, their associated display elements.

The row and column conductors 12 and 14, TFTs 16 and electrodes 20 are all carried on a transparent plate 22, for example of glass or quartz.

Parallel to and spaced from this plate, is a further transparent plate 24, for example of glass, on which is formed a continuous transparent conductive layer of ITO constituting a common electrode 26 for all the display elements of the device. Liquid crystal material 28 is disposed between the two plates, the two plates being sealed around their periphery to contain the material.

In use, the display panel, operating in transmissive mode, is illuminated by a light source disposed to one side of the panel facing the plate 24 so that light, indicated by the arrow A, enters the device through this plate and exits through the plate 22, duly modulated according to the transmission characteristics of the display elements 10. The operation of this kind of display device is generally well known and as such will not be described here in detail. Briefly, however, the liquid crystal material serves to modulate light through the device depending on a voltage applied thereacross with each display element 10, as defined by a display element electrode 20, an opposing portion of the common electrode 26 and the liquid crystal material therebetween, being individually operable to vary light transmission through the device in accordance with a drive voltage applied across its electrodes.

Row addressing of the array of picture elements is achieved by applying a gating signal to each row conductor 12 in turn which turns on all TFTs in the row. Video data signals are applied to the column conductors 14 for each row of picture elements in turn in synchronism with the gating signals, these data signals being transferred to the appropriate row of display elements via the on TFTs of that row. By addressing each row of picture elements in turn, a complete TV picture is build up.

Figure 2:
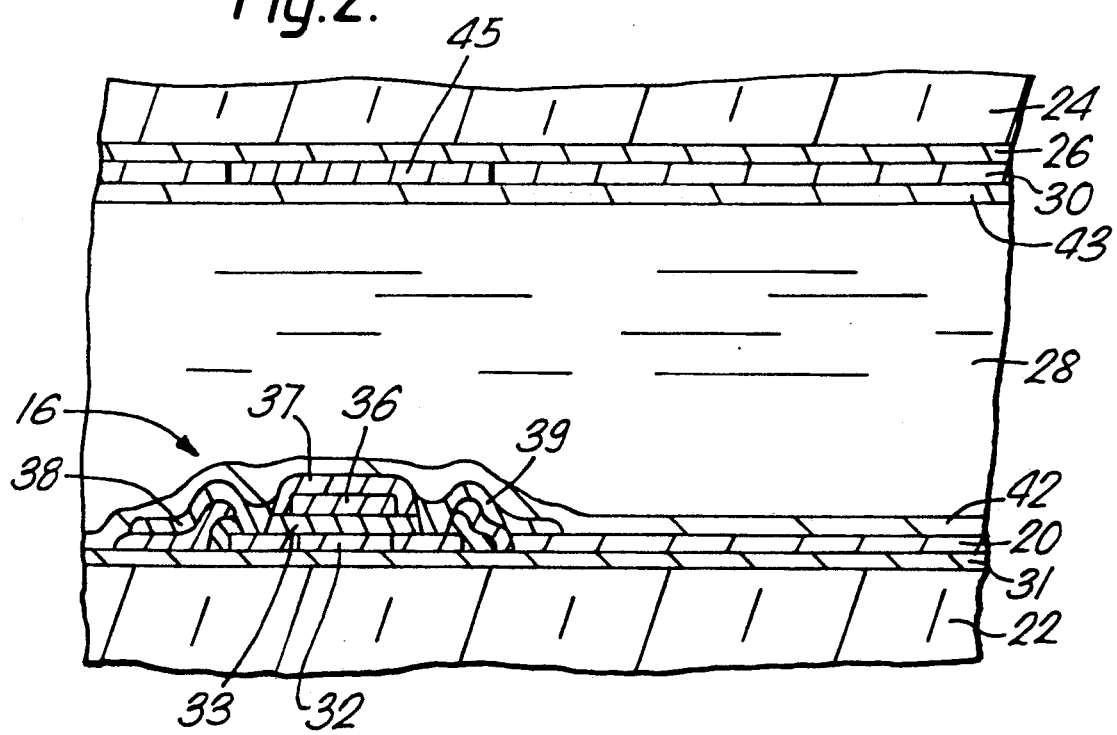
FIG. 2 is a schematic cross-sectional view, not to scale, through part of a representative display element of the device of FIG. 1.

A cross-section through a part of a typical display element and its associated TFT is illustrated schematically in FIG. 2. The TFTs 16 in this embodiment comprise polycrystalline silicon TFTs. The plate 22 is covered with a continuous layer 31 of silicon dioxide on which the display element electrodes 20 and TFTs 16 are formed although, depending on the nature of plate material, this could be omitted. Each TFT comprises a structure having superimposed layers which include a semiconductor layer 32, of polysilicon, providing a channel region. Portions of the layer 32 at either end of the channel region are doped (n+ type) to provide source and drain contact regions. The layer 32 is covered by a layer 33 of silicon dioxide whose central region, that is, the region overlying the channel region at the layer 32, serves as the gate insulator layer. A gate 36 of doped polysilicon (n+ type) is defined on the layer 33 overlying the channel region. Silicide may alternatively be used as the gate material. A further silicon dioxide layer 37 extends over the layer 32 and the gate 36 to act as a passivation layer. Source and drain terminals 38 and 39 of metal, for example aluminium, are provided on the layer 37 and extend through windows etched in the layers 37 and 33 to contact the doped end regions of the layer 32. The drain terminal 39 is connected to the ITO display element electrodes 20 and the source terminal 38 comprises an extension of an associated column conductor 14. The gate 36 is connected to row conductor 12 via an extention, not visible in FIG. 2.

The TFTs 16 may be fabricated in a number of different ways as will be apparent to persons skilled in the art. It will be understood therefore that the particular device structure shown in FIG. 2 is merely an example of one kind of structure and that TFTs of different structure and employing alternative semiconductor materials, for example an amorphous silicon alloy, could be employed.

The TFTs, element electrodes and row and column address conductors on the plate 22 are covered by a continuous molecular alignment layer 42.

Referring to both FIGS. 1 and 2, the display panel 11 is further provided with a filter mosaic layer carried on the plate 24 over the electrode 26 and having three sets, red, green and blue, of individual filter elements 30. The individual color filter elements 30 are each in registration with a respective display element 10 and are arranged in a repeating pattern of groups of three, each group having a red (R), green (G) and blue (B) filter element constituting a colour triplet in known fashion.

The liquid crystal material 28 is bounded by a continuous molecular alignment layer 43 of suitable insulative material such as polyimide carried on the plate 24 over the filter elements 30.

Individual filter elements 30 of the filter mosaic layer are segregated from their neighbours by strips of light absorbing material which forms a grid structure. The area of this light absorbing material, for example of black dyed polyimide, is increased at regions overlying the TFTs, as shown at 45 in FIG. 2, and serves as a light shield. These regions could alternatively be omitted. White light from the light source entering the display panel at the region of a display element 10 is filtered by the associated filter element 30 before being modulated by the display element and transmitted through the plate 22 to provide a respectively colored output. The absorbing material has the effect of enhancing color purity and display contrast.

The differently colored display elements thus form three groups, that is groups of red operating, green operating and blue operating display elements respectively. The TFTs associated with each group differ structrually from the TFTs associated with the other two groups for the purpose of reducing photoconductivity effects in their channel regions whereas the TFTs associated with any one group are substantially identical to one another. Light absorption in the semiconductor layer 32 of the TFT's structure, which is responsible for photo-induced currents, is wavelength dependent due to optical interference effects resulting from the thinness of the structure layers. With this in mind the thickness of one or more of the layers of the TFTs are tailored according to the color of light with which they operate so as to minimize or at least reduce absorption in the semiconductor layer 32 for the wavelength or a principal wavelength of the wavelength range concerned compared with that which would otherwise occur if layer thicknesses were not so selected. Thus, for example, the TFTs associated with the group of red display elements have a certain gate insulator layer thickness selected such that the amount of light absorbed in their semiconductor layers 32, approaches a minimum, and the groups of TFTs associated with the green and blue display elements respectively have selected gate insulator layer thicknesses which are different to this thickness, and one another, such that, similarly, the amount of light absorption in their respective semiconductor layers approaches a minimum.

In this embodiment, the thicknesses of the semiconductor, gate insulator and gate layer are each specifically selected for each group of TFTs according to the color light to which they are subjected for optimum results in minimising light absorption in their semiconductor layers through interference effects. However, an improvement can be obtained by selecting an appropriate thickness for two or just one of the layers. In order of importance in this respect, it is considered that the gate insulator layer is likely to have the greater influence, followed by the semiconductor layer and then the gate layer. Hence, only the gate insulator layer thickness or the gate insulator and semiconductor layers thicknesses need be different for each group. Additionally, the thicknesses of the passivating layer may also be tailored for optimum effect.

For illustrative purposes it will be assumed for the following discussion that the green, red and blue light to which TFTs are subjected in operation have principal wavelengths of approximately 0.54 μm, 0.61 μm and 0.45 μm respectively. These values of the principal wavelengths are determined by the type of light source and the filter characteristics and accordingly could vary from these particular values.

Figure 3:
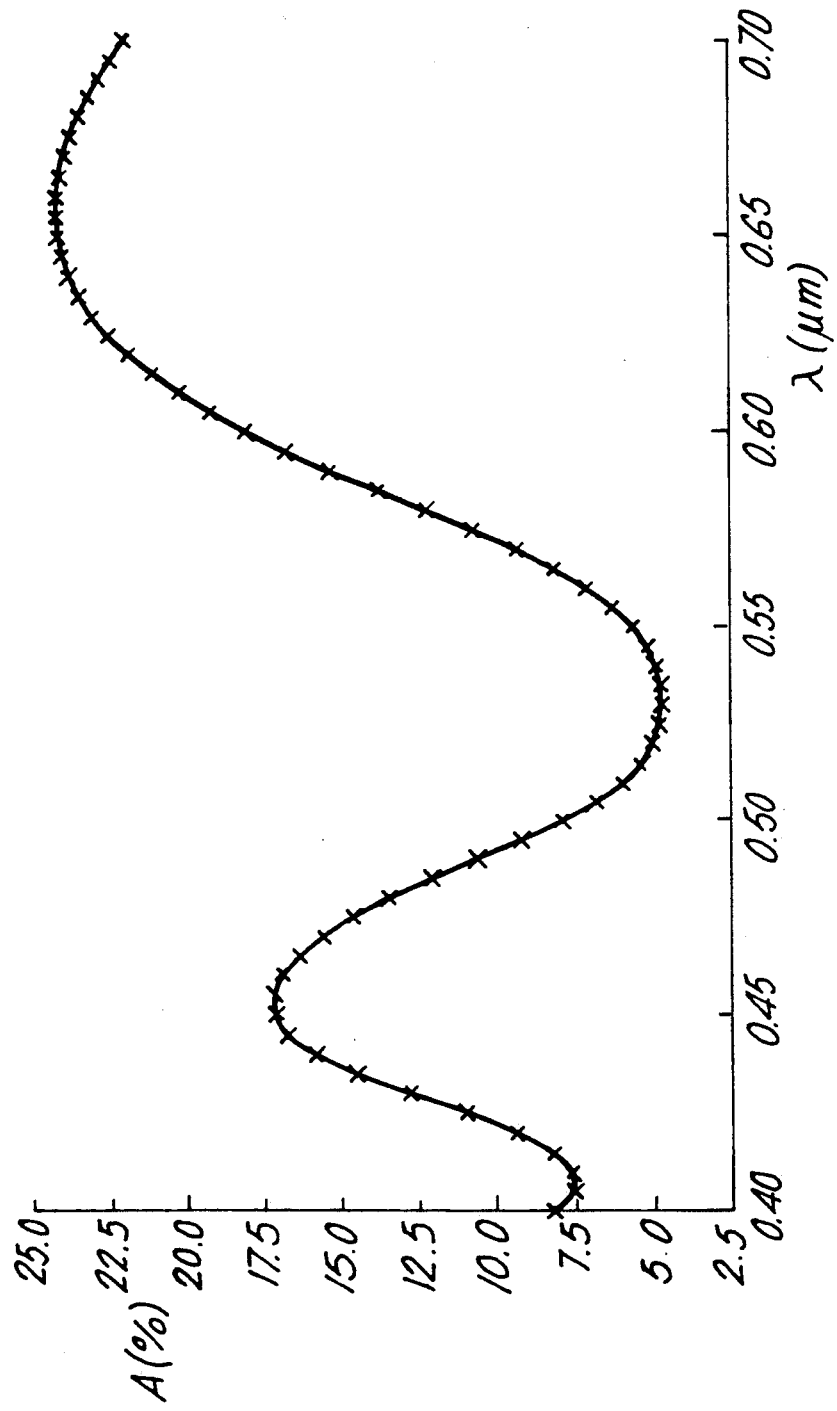
FIG. 3 illustrates graphically the relationship between the wavelength of illumination light and the extent of light absorption, A, in the semiconductor layer of a TFT used in the display device.

The graph of FIG. 3 shows the theoretical relationship between the wavelength of light, λ, and absorption, A, (as a percentage of the light incident on the TFT) in the polysilicon layer 32 of a typical one of the TFTs 16 associated with green operating display elements. As can be seen, greatest absorption occurs at a wavelength of around 0.65 μm, while a second, smaller, absorption peak occurs at around 0.45 μm.

More importantly, a minimum absorption occurs at around 0.54 μm, corresponding to the principal wavelength of light to which this TFT is subjected. The particular response characteristic shown in FIG. 3 results from computations using mathematical expressions known in the field of optical interference technology in which, when considering the semiconductor layer, gate insulator layer, and gate layer of the TFT's structure, the optical thicknesses of these layers are made equal to an odd multiple of a quarter wavelength, that is, the layer optical thickness is equal approximately to n λ/4 where n is an odd number and λ is the light wavelength, namely 0.54 μm.

In order to provide reasonable layer thicknesses to work with and to facilitate fabrication of the TFT, the value of n in determining the gate layer, gate insulator layer and semiconductor layer is chosen in practice to be 5, 3 and 5 respectively. Thus, taking for example the polysilicon semiconductor layer 32 the optical thickness of this layer is chosen to be 0.675 μm. Assuming for simplicity a refractive index value for polysilicon of 3.8, the physical thickness of the layer 32 becomes 0.178 μm. For the gate insulator (silicon dioxide) layer 33 an optical thickness of 0.405 μm is obtained, giving a physical thickness, assuming the refractive index of this material to be 1.48, of 0.27 μm. Lastly the gate layer 36 is chosen to have an optical thickness of 0.675 μm.

Figure 4:
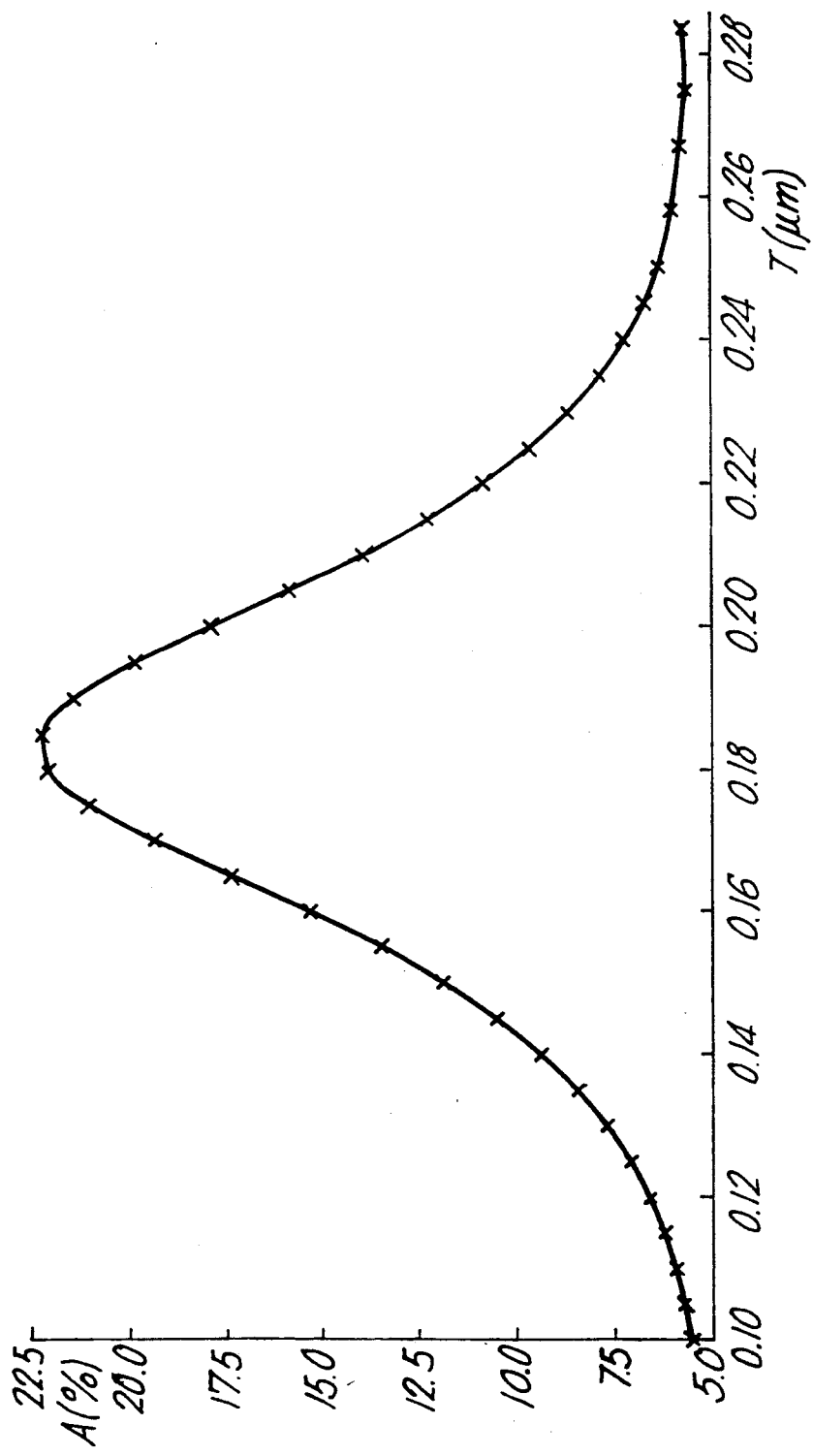
FIG. 4 illustrates graphically the relationship between absorption, A, in the semiconductor layer of a TFT and the thickness, T, of the gate insulator layer for a given light wavelength.

FIG. 4 is a graph showing the theoretical amount of light absorption in the polysilicon layer 32, as a percentage, for a range of thicknesses T of the gate insulator layer 33 in the case of green light namely 0.54 μm wavelength and illustrates the typifying variation of absorption in accordance with layer thickness. The portion of the characteristic plotted in the graph covers a range of thicknesses which would be desirable in practice. Thus it is seen that for this particular wavelength light a miximum absorption occurs at a gate insulator layer thickness of around 0.18 μm and a minimum absorption occurs at around 0.09 μm and 0.27 μm. If the graph were to be extended to include greater thicknesses, the absorptive curve would rise again to reach another maximum at around 0.37 μm.

Accordingly, the thickness of the gate insulator layer 32 of the TFTs associated with the group of green display elements is chosen to be approximately 0.27 as this is the more convenient bearing in mind ease of fabrication of the layer and its desired function and reliability in operation of the TFT.

In the mathematical determination of the above values, it is assumed for simplicity that the light is incident normally on the TFT structure, and is directed onto the passivation layer side. Some light in practice may be incident on the structure other than normally but for such light the calculations are significantly more complex. Since it can be expected that most light will impinge on the structure at or near the normal the effects of light arriving at other angles has not been taken into account. It has also been assumed for the purpose of simplifying the calculations that the passivation layer 37 and plate 22 (with layer 31 if present) are of infinite thickness. The effect of the layer 31, if present, is considered negligible as its refractive index is virtually the same as that of the underlying plate 22. The thickness of the layer 37 plays a part in determining the absorption in the semiconductor layer but to a much lesser extent than the other three layers discussed above. Having chosen the thicknesses of the gate, gate insulator and semiconductor layers in the manner described, the thickness of the passivation layer can be tailored, if so desired, for optimum effect in minimising absorption in the semiconductor layer. To this end, the passivating oxide layer has a selected optical thickness of an odd multiple of half wavelengths. In this example, the optical thickness is chosen to be one and a half wavelengths, corresponding to a physical thickness of approximately 0.55 μm.

The thicknesses of the layers used in the TFTs associated with the other two display element groups, red and blue, are chosen in a similar manner. The characteristic absorption curves for these other two TFT types is similar to that shown in FIG. 3 except that they are shifted in opposite directions respectively along the wavelength ordinate axis with the point of minimum absorption corresponding to the light wavelength, for example 0.45 μm and 0.61 μm for blue and red light respectively. On the basis of these wavelengths and assuming that polysilicon gates are used, and that the refractive indices, n, of the material of the semiconductor and gate layers is 3.8 and of the gate insulator material (silicon oxide) is 1.48, then the TFTs operating with blue light are fabricated with the physical thicknesses of the gate layer, the gate insulator layer and the semiconductor layer being approximately 0.148 μm, 0.228 μm, and 0.148 μm, respectively and the TFTs operating with red light are fabricated with the physical thicknesses of the gate layer, gate insulator layer and semiconductor layer beign, approximately 0.2 μm, 0.31 μm, and 0.2 μm, respectively. The optical thicknesses of their passivating oxide layer may then, if desired, be tailored to an optimum value, corresponding to an odd multiple of half wavelengths, which, in conjunction with these layer thicknesses, produces a minimised absorption in the semiconductor layers.

Thus, it is seen that the layer thicknesses of the three groups of TFTs differ from group to group, the values being chosen according to the color with which they operate so as to bring to a minimum the amount of light absorption in their semiconductor (channel) layers.

The form of TFT structure described above is a comparatively simple one and is used by way of example to illustrate the invention. Alternative materials and various constructional modifications are possible as will be apparent to skilled persons, and it should be understood therefore, that the inventive concept is not limited to the particular example described but can be applied equally to differend kinds of TFTs having other structure forms comprising superimposed layers and/or employing different materials.

Figure 5:
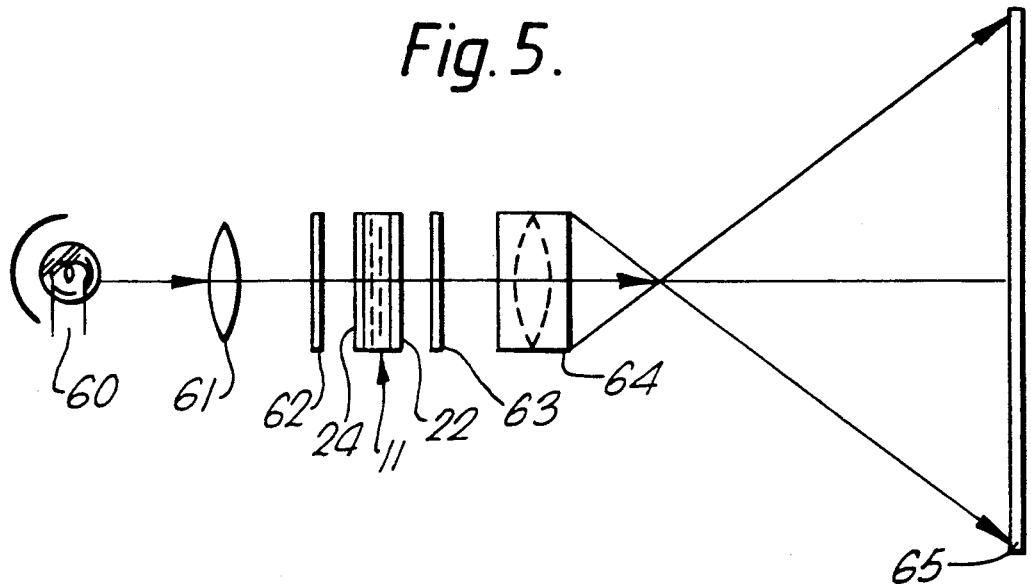
FIG. 5 shows schematically the display device of FIG. 1 in use as a projection display device.

Referring now to FIG. 5, the display device of FIGS. 1 and 2 is shown in use as a simple form of projection display device. A suitable source of white light 60, for example a tungsten halogen or arc lamp is combined with a reflector and disposed to one side of the display panel 11 and directs light through a condensing lens 61 towards the plate 24, via a polarising sheet, 62. A further polarising sheet 63, is disposed on the other side of the panel 11 adjacent the plate 22. Light transmitted by the display panel, consisting of the individual and respectively colored display element outputs then passes through a projection lens 64 system which focusses the image from the display panel onto a projection screen 65. In a modified form of this device, the projection lens 64 and the screen 65 may be omitted and the light output from the panel 11 instead viewed directly. Naturally, for this modified arrangement a less powerful light source would be used.

Figure 6:
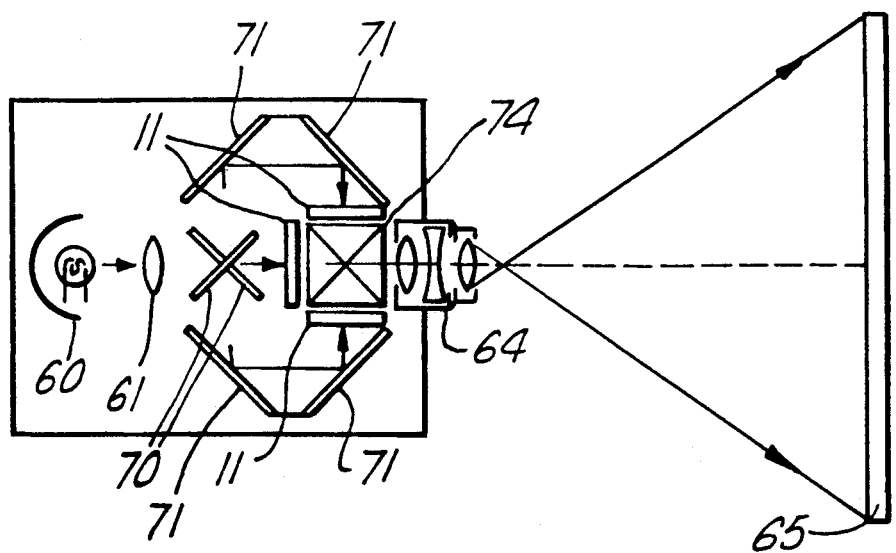
FIG. 6 shows schematically another embodiment of a display device according to the invention in operation as a projection display device and using a modified form of the panel shown in FIGS. 1 and 2.

In another embodiment of display device used as a projection display device, and as illustrated in FIG. 6, three separate display panels 11 are employed, each of which is illuminated with light of a respective and different primary color. Each panel is similar to that of FIGS. 1 and 2 except that as they are used with light of the appropriate color and operate individually as monochrome display panels the array of filter elements 30 is omitted. The plate 24 therefore carries only the common electrode layer 26, the molecular alignment layer 43 and discrete light shields of light absorbing material overlying respective TFTs.

In this arrangement then the three groups of red, green and blue display elements are provided respectively by the display element arrays of each of the separate panels. The TFTs 16 of each panel are configured as described previously in accordance with the color light with which their association display elements are to operate so as to minimise photo-induced currents. Thus the TFTs of one panel are all substantially identical but differ from the TFTs of the other two panels as regards the layer thicknesses utilised. As there is no requirement to form differently structured TFTs in the same panel fabrication of the individual panels is simpler than that of the previous embodiment. White light from a lamp/reflector assembly 60 is directed through a condensing lens 61 to a crossed pair of dichroic mirrors 70 where it is split into red, green and blue portions of the spectrum. These three color portions are then passed to the three monochrome type display panels 11, directly or by reflection from light of mirrors 71 as the case may be such that each panel 11 is illuminated with light of a respective, different primary color. Again, each display device has input and output polarising sheets although these are not shown in FIG. 6.

After modulation by their respective display panels, the three color portions are recombined by way of a dichroic prism 74. The recombined light is projected by a projection lens 64 to a projection scren 65.

I claim:

1. An active matrix liquid crystal display device comprising a multiplicity of liquid crystal display elements, each controlled by a thin film transistor, (TFT) having a gate layer, a semiconductor layer providing a channel region insulated from the gate layer by a gate insulation layer, and means for illuminating the display elements, the display elements comprising groups providing outputs of respective different colors, characterised in that the thickness of at least one of said layers of the TFTs differ from one group to another group and is selected in accordance with the color of light within which each group operates such that interference effects results in a small amount of absorption of said colored light in the semiconductor layer.

2. An active matrix liquid crystal display device according to claim 1, characterised in that the thicknesses of at least the semiconductor and gate insulation layers of the TFTs are selected according to the principal wavelength of the colored light to which the TFT is subjected in operation such that interference effects results in a small amount of absorption of the principle wavelength of the colored light in the semiconductor layer.

3. An active matrix liquid crystal display device according to claim 2, characterised in that the optical thicknesses of the semiconductor and gate insulation layers of each TFT are an odd multiple of one quarter of the principal wavelength of the colored light to which the TFT is subjected.

4. An active matrix liquid crystal display device according to claim 3, characterised in that the semiconductor and gate insulation layers have an optical thickness respectively of five quarter, and three quarter wavelengths.

5. An active matrix liquid crystal display device according to claim 3, characterised in that the gate layer has been optical thickness of five quarter wavelengths.

6. An active matrix liquid crystal display device according to claim 3, characterised in that the TFTs further comprise a passivation layer overlying the gate layer and in that the optical thickness of the passivation layer is selected to be an odd multiple of one half the respective wavelength of the colored light to which the TFTs are subjected.

7. An active matrix liquid crystal display device according to claim 4, characterized in that the TFTs further comprise a passivation layer overlying the gate layer and in that the optical thickness of the passivation layer is selected to be an odd multiple of one half the respective wavelength of the colored light to which the TFTs are subjected.

8. An active matrix liquid crystal display device according to claim 5, characterized in that the TFTs further comprise a passivation layer overlying the gate layer and in that the optical thickness of the passivation layer is selected to be an odd multiple of one half the respective wavelength of the colored light to which the TFTs are subjected.

9. An active matrix liquid crystal display device according to claim 6, characterized in that the TFTs further comprise a passivation layer overlying the gate layer and in that the optical thickness of the passivation layer is selected to be an odd multiple of one half the respective wavelength of the colored light to which the TFTs are subjected.

10. An active matrix liquid crystal display device according to claim 1, characterized in that the device includes an array of color filter elements wherein the color filter elements of the array comprise two or more different color filter element sets, each of said color filter elements being associated with a respective display element.

11. An active matrix liquid crystal display device according to claim 2, characterized in that the device comprises an array of color filter elements wherein the color filter elements of the array comprise two or more different color filter element sets, each of said color filter elements being associated with a respective display element.

12. An active matrix liquid crystal display device according to claim 3, characterized in that the device comprises an array of color filter elements wherein the color filter elements of the array comprise two or more different color filter element sets, each of said color filter elements being associated with a respective display element.

13. An active matrix liquid crystal display device according to claim 4, characterized in that the device comprises an array of color filter elements wherein the color filter elements of the array comprise two or more different color filter element sets, each of said color filter elements being associated with a respective display element.

14. An active matrix liquid crystal display device according to claim 5, characterized in that the device comprises an array of color filter elements wherein the color filter elements of the array comprise two or more different color filter element sets, each of said color filter elements being associated with a respective display element.

15. A active matrix liquid crystal display device according to claim 6, characterized in that the device comprises an array of color filter elements wherein the color filter elements of the array comprise two or more different color filter element sets, each of said color filter elements being associated with a respective display element.

16. An active matrix liquid crystal display device according to claim 1, characterised in that the device comprises two or more display panels each having an array of display elements and being illuminated with light of a different color.

17. An active matrix liquid crystal display device according to claim 2, characterized in that the device comprises two or more display panels each having an array of display elements and being illuminated with light of a different color.

18. An active matrix liquid crystal display device according to claim 3, characterized in that the device comprises two or more display panels each having an array of display elements and being illuminated with light of a different color.

19. An active matrix liquid crystal display device according to claim 4, characterized in that the device comprises two or more display panels each having an array of display elements and being illuminated with light of a different color.

20. An active matrix liquid crystal display device according to claim 5, characterized in that the device comprises two or more display panels each having an array of display elements and being illuminated with light of a different color.

21. An active matrix liquid crystal display device according to claim 6, characterized in that the device comprises two or more display panels each having an array of display elements and being illuminated with light of a different color.

22. An active matrix liquid crystal display device according to claim 10 or claim 16, characterised in that the device further includes a projection lens system for projecting the output from the display elements onto a screen.

23. An active matrix liquid crystal display device according to claim 1, characterised in that the semiconductor layer of the TFTs comprises a polycrystalline silicon material.

24. An active matrix liquid crystal display device according to claim 2, characterized in that the semiconductor layer of the TFTs comprises a polycrystalline silicon material.

25. An active matrix liquid crystal display device according to claim 3, characterized in that the semiconductor layer of the TFTs comprises a polycrystalline silicon material.

26. An active matrix liquid crystal display device according to claim 4, characterized in that the semiconductor layer of the TFTs comprises a polycrystalline silicon material.

27. An active matrix liquid crystal display device according to claim 5, characterized in that the semiconductor layer of the TFTs comprises a polycrystalline silicon material.

28. An active matrix liquid crystal display device according to claim 10, characterized in that the semiconductor layer of the TFTs comprises a polycrystalline silicon material.

29. An active matrix liquid crystal display device according to claim 16, characterized in that the semiconductor layer of the TFTs comprises a polycrystalline silicon material.

30. An active matrix liquid crystal display device according to claim 22, characterized in that the semiconductor layer of the TFTs comprises a polycrystalline silicon material.

* * * * *